(12) United States Patent
Meister et al.

(10) Patent No.: US 7,589,453 B2
(45) Date of Patent: Sep. 15, 2009

(54) WIDE BANDWIDTH ACOUSTIC SURFACE WAVE COMPONENT

(75) Inventors: Veit Meister, Kagel (DE); Urlike Rösler, Hebertshausen (DE); Werner Ruile, Munich (DE)

(73) Assignee: EPCOS AG, Munich (DE)

( * ) Notice: Subject to any disclaimer, the term of this patent is extended or adjusted under 35 U.S.C. 154(b) by 0 days.

(21) Appl. No.: 11/720,576

(22) PCT Filed: Oct. 20, 2005

(86) PCT No.: PCT/EP2005/011310

§ 371 (c)(1),
(2), (4) Date: Jul. 5, 2007

(87) PCT Pub. No.: WO2006/058579

PCT Pub. Date: Jun. 8, 2006

(65) Prior Publication Data

US 2008/0012450 A1  Jan. 17, 2008

(30) Foreign Application Priority Data

Dec. 1, 2004  (DE) .......... 10 2004 058 016

(51) Int. Cl.
*H03H 9/25* (2006.01)
*H01L 41/047* (2006.01)

(52) U.S. Cl. .......... 310/313 R; 310/340; 310/364
(58) Field of Classification Search .......... 310/313 R, 310/340, 364
See application file for complete search history.

(56) References Cited

U.S. PATENT DOCUMENTS 4,521,476 A * 6/1985 Asai et al. .......... 428/209
7,218,038 B2 * 5/2007 Matsuda et al. .......... 310/364
2002/0195905 A1 * 12/2002 Kobayashi et al. .......... 310/363
2003/0137367 A1   7/2003 Kadota (Continued)

FOREIGN PATENT DOCUMENTS

DE  069607510  4/2000

(Continued)

OTHER PUBLICATIONS

Asia, Kengo et al., "Experimental and Theoretical Investigation for Temperature Characteristics and Propagation Losses of SAWs on $SiO_2Al/LiTaO_3$", *Ultrasonics symposium Proc.*, 2002.

(Continued)

*Primary Examiner*—Thomas M Dougherty
(74) *Attorney, Agent, or Firm*—Fish & Richardson P.C.

(57) ABSTRACT

A surface acoustic wave component includes a piezoelectric substrate and an electrode structure that includes multiple layers and that is on the piezoelectric substrate. A dielectric layer is above the electrode structure. The dielectric layer has an acoustic impedance $Z_{a,d}$. The multiple layers include a first layer system that includes at least one first layer made of a first material, which has an acoustic impedance that is less than $2Z_{a,d}$. The second layer system includes at least one second layer made of a second material, which has an acoustic impedance that exceeds $2Z_{a,d}$. The second layer system has a height that is between 15% and 85% of a total height of the multiple layers.

20 Claims, 1 Drawing Sheet

U.S. PATENT DOCUMENTS

| | | | |
|---|---|---|---|
| 2003/0155844 A1* | 8/2003 | Anasako | 310/364 |
| 2004/0140734 A1 | 7/2004 | Nakao et al. | |
| 2005/0224450 A1* | 10/2005 | Barber et al. | 216/37 |
| 2006/0071579 A1* | 4/2006 | Kando | 310/313 R |
| 2006/0175639 A1* | 8/2006 | Leidl et al. | 257/245 |

FOREIGN PATENT DOCUMENTS

| | | |
|---|---|---|
| EP | 0734120 | 9/1996 |
| EP | 0991186 | 4/2000 |
| EP | 1330026 | 7/2003 |
| JP | 10-247835 * | 9/1998 |
| WO | WO 03/069775 | 8/2003 |
| WO | WO04/070946 | 8/2004 |

OTHER PUBLICATIONS

Takayama, R. et al., "High Power Durable Electrodes for GHz Band SAW Duplexers", IEEE Ultrasonics Symposium, vol. 1, pp. 9-13, 2000.

English translation of Search Report for PCT/EP2005/011310.

Written Opinion for PCT/EP2005/011310.

Translation of Written Opinion for PCT/EP2005/011310.

* cited by examiner

WIDE BANDWIDTH ACOUSTIC SURFACE WAVE COMPONENT

TECHNICAL FIELD

This patent application describes a surface acoustic wave component, such as a high-frequency filter.

BACKGROUND

The bandwidth of a high-frequency filter should equal at least 5% of the center frequency of the filter. For surface acoustic wave components to be used in front-end modules, the power compatibility of electrode structures of the component is a consideration.

Power-resistant electrode structures with a layer of sequence of AlMgCu or AlZrCu and Ti are known from the publication R. Takayama et al., "High Power Durable Electrodes for GHz Band SAW Duplexers," Ultrasonic Symposium, 2000 IEEE, Vol. 1, pp. 9-13.

From the publications EP 0734120 B1 and US2004/0140734 A1, a surface acoustic wave component is known, in which a surface of a piezoelectric substrate with electrode structures arranged thereon is covered with a temperature-compensating layer made from silicon dioxide. The electrode structures are formed by a layer made from Al or an Al alloy.

Another surface acoustic wave component, in which electrode structures covered with a SiO$_2$ layer primarily contain Ag, is known from the publication US2003/0137367A1.

SUMMARY

Described herein is a surface acoustic wave component that has a relatively high power compatibility and a relatively large bandwidth.

A surface acoustic wave component has strip-shaped electrode structures, which are arranged periodically on a piezoelectric substrate and which are connected to busbars. The distance between the centers of two electrode structures that are connected to the same electrical potential determines the wavelength of the surface wave in the appropriate component structure.

The bandwidth of a surface acoustic wave component depends on the intensity of the acoustic reflection at the edges of electrode structures or of the corresponding acoustic impedance discontinuity.

The acoustic impedance of a material can be determined from the formula $Z_a = (\rho c)^{1/2}$, where c is the stiffness and $\rho$ is the mass density of the material. The acoustic impedance discontinuity takes place at a boundary between two materials, e.g., at an electrode edge, if $Z_a$ in the two adjoining materials is different.

If the surface of the piezoelectric substrate of a component with the electrode structures arranged thereon is covered by a dielectric layer (e.g., silicon dioxide) having a similar acoustic impedance as that of the material of the electrode structures (typically aluminum), this results in an insufficient acoustic reflection at the electrode edges, i.e., at the boundary between the electrode structures and the dielectric layer.

However, the reflection intensity of the surface acoustic waves can be influenced by the material of the electrode structures. The acoustic impedance discontinuity or the reflection intensity at the electrode edges can be increased, e.g., by providing at least one thick layer with a significantly different acoustic impedance—relative to the acoustic impedance in the dielectric layer—in the layer arrangement of the electrode structures. By suitably selecting the thickness of this layer, it is possible to adjust the acoustic reflection intensity necessary in the application.

A surface acoustic wave component is described herein with a piezoelectric substrate and multi-layer electrode structures that are arranged on this substrate and are covered by a dielectric layer with an acoustic impedance $Z_{a,d}$. The layer arrangement of the electrode structures comprises a first layer system, which is composed of at least one first layer made from a first material in which the acoustic impedance $Z_{a,1}$ is less than $2Z_{a,d}$, and a second layer system, which is composed of at least one second layer made from a second material, in which the acoustic impedance $Z_{a,2}$ equals at least $2Z_{a,d}$. The relative percentage of the total thickness of the second layer system relative to the total height of the multi-layer arrangement equals between 15% and 85%, e.g., a maximum of 60%.

As a first material, e.g., Al, Mg, Ti, or an aluminum alloy is suitable. As a second material, e.g., Cu, Ta, Mo, Cr, W, Ag, Pt, Au, or an alloy of these metals is suitable.

A high-frequency filter, which is characterized by its center frequency and bandwidth, may be implemented using the component.

The electrode structures may be distinguished by high power compatibility and long service life, in addition to a large bandwidth.

The overall height of the electrode structures may be between 5% and 10% of the wavelength of a surface acoustic wave. This wavelength is substantially equal to the center-to-center distance between two strip-shaped electrode structures connected to the same electrical potential.

In one implementation, the second layer system is composed of a single second layer, such as a Cu layer or a W layer. This layer may be the lowermost layer or one of the lower layers of the multi-layer arrangement. However, the second layer can also form the uppermost layer of the multi-layer arrangement. The second layer can alternatively also be arranged at a different position in the multi-layer arrangement, e.g., between two first layers.

The first layer system can be composed of a single first layer, which may be made from Al or an Al alloy. The first layer system can alternatively be composed of several first layers that may be separated from each other. Different layers of the first layer system can be composed of the same material, e.g., Al. Different layers of the first layer system can also be composed of differing materials.

In the second layer system, multiple similar or dissimilar second layers, e.g., made from Cu, can be provided. In a variant, there can be several differing second layers in the second layer system—for example, a Cu layer and also an Au layer as another second layer.

For multiple first and second layers, the first layers may be arranged in alternating sequence with the second layers. Different layers of the first (or the second) layer system can also border each other.

The relative total thickness of the second layer thickness with respect to the overall height of the multi-layer arrangement may be between 25% and 50%.

In one embodiment, a layer of the multi-layer arrangement facing the piezoelectric substrate is a bonding agent layer, e.g., made from titanium.

The dielectric layer—e.g., silicon dioxide or silicon nitride—may be a temperature-compensating layer, whose coefficient of thermal expansion has an opposite sign relative to the piezoelectric substrate and/or the electrode structures. A temperature-compensating layer counteracts the expansion of the component structures and prevents the center frequency of the component from shifting due to thermal expansion of the components when there are temperature changes.

The height of the dielectric layer (measured starting at the surface of the piezoelectric substrate) may be between 20% and 40% of the wavelength of a surface acoustic wave in the component.

Embodiments are explained below with reference to associated figures. The figures show different embodiments with reference to schematic and not-true-to-scale representations. Parts that are identical or that have identical functions are designated with identical reference symbols.

DETAILED DESCRIPTION

Figure 1:
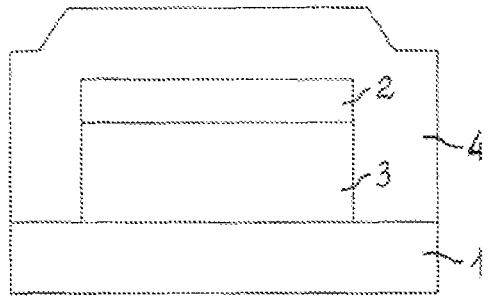
FIG. 1, an example of a layer arrangement of an electrode structure with the first layer as the lowermost layer of the multi-layer arrangement.

In FIG. 1, a component with an electrode structure is shown. The electrode structure is arranged on a piezoelectric substrate 1 and is composed of a first layer 3 (e.g., Al layer) arranged at the bottom, above which there is a second layer 2 (e.g., a Cu layer). The layers 2, 3 form a layer stack.

The electrode structure is covered by a dielectric layer 4, such as silicon dioxide. The dielectric layer 4 seals to the surface of the substrate 1 and in this way encapsulates the electrode structure 2, 3.

The substrate 1 can be composed of lithium tantalate, lithium niobate, quartz, or another suitable piezoelectric material. The substrate can also be composed of several layers, with at least the uppermost layer of the substrate having piezoelectric properties.

Figure 2:
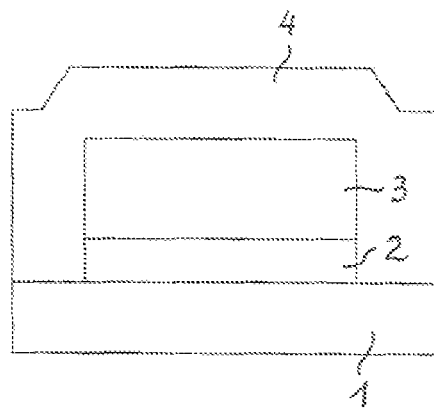
FIG. 2, an example of a layer arrangement of an electrode structure with the first layer as the uppermost layer of the multi-layer arrangement.

FIG. 2 shows an embodiment, in which the second layer 2 is arranged underneath the first layer 3.

Figure 3:
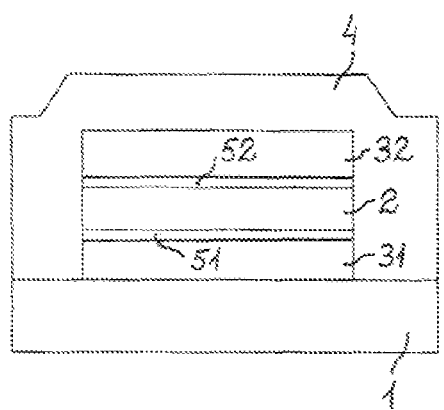
FIG. 3, an example of a layer arrangement of an electrode structure with a second layer arranged between two first layers.

In the variant shown in FIG. 3, the second layer 2 is arranged between two first layers 31, 32. The first layer system comprises first layers 31, 32, which each border a bonding agent layer 51, 52—constructed here as another first layer. The bonding agent layer 51 is arranged between the lower first layer 31 and the second layer 2. The bonding agent layer 52 is arranged between the upper first layer 32 and the second layer 2.

A bonding agent layer is used for an improved connection between two layers and can be arranged between a first and a second layer, between the uppermost layer of the multi-layer arrangement and the dielectric layer or between a lowermost layer (the second layer 2 in FIG. 5 or the first layer in FIG. 3) and the piezoelectric substrate 1.

The bonding agent layers 5, 51, 52 associated with the first layer system may be made from Ti due to their acoustic velocity. The bonding agent layers 5, 51, 52 can also be selected as second layers, e.g., made from Pt, and can be allocated to the second layer system.

Figure 4:
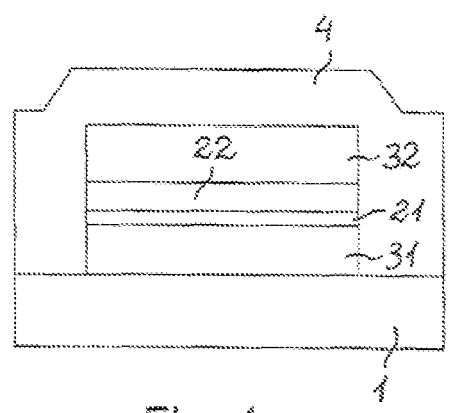
FIG. 4, a variant of the construction shown in FIG. 3 with two second layers bordering each other.

FIG. 4 shows a variant with two second layers 21, 22 adjoining one another and made from differing second materials, which together form the second layer system. The composite of these layers is here arranged between two first layers 31, 32. The arrangement of this composite instead of only one second layer 2 according to FIG. 1 or 2 is also possible.

Two second layers 21, 22 made from different second materials can also be separated by at least one first layer or one bonding agent layer.

Figure 6:
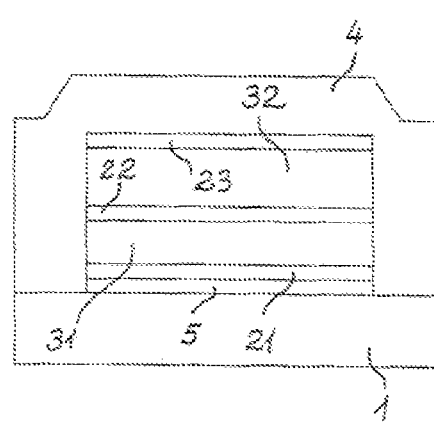
FIG. 6, the layer arrangement of an electrode structure with alternating first and second layers.

FIGS. 3, 6, two first layers 31, 32 are separated from each other. The different first layers may be composed of the same first material. The different first layers can alternatively be composed of different first materials—in particular in the case of successive first layers. Also, two first layers separated from each other can be composed of different materials (e.g., different Al alloys).

Figure 5:
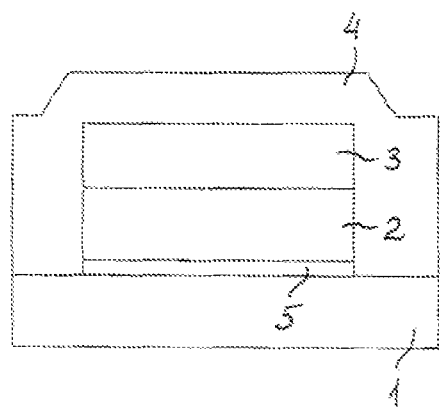
FIG. 5, the layer arrangement of an electrode structure with a bonding agent layer facing the piezoelectric substrate.

In FIGS. 1 to 4, the relative thickness of the second layer 2 or the relative total thickness of the layers 21, 22, may be between 20% and 30% of the overall height of the electrode structure. FIG. 5 shows a variant with a second layer 2, whose height percentage in the overall height of the electrode structure equals between 40% and 50%.

In FIG. 6, several second layers 21, 22, 23 and several first layers 31, 32, which alternate, are provided in the multi-layer arrangement of the electrode structure.

The percentage of the total thickness of the second layers 21, 22, 23 relative to the overall height of the electrode structure, where the percentage is equal to the sum of the individual layer thicknesses of these layers, is between 15% and 60%.

The second layers 21, 22, 23 (or the first layers 31, 32) can have the same thickness. Different thicknesses for the second (or the first) layers in a multi-layer arrangement are also possible. In one variant, the lowermost second layer 21 is thicker than the additional second layers 22, 23 lying on top of this lowermost layer.

In embodiments, the first layers 2, 21, 22, 23 each have a significantly higher density and/or stiffness than the dielectric layer 4.

In the variant shown in FIG. 6, a bonding agent layer 5 is arranged between the piezoelectric substrate 1 and the lowermost second layer 21.

All of the second layers 21, 22, 23 may be separated from each other are composed of the same second material. However, it is also possible to select different second materials for the layers 21, 22, 23.

The features of the variants presented in the figures can be combined with each other. The claims are not limited to the illustrated elements or the listed materials. The claims are not limited to certain applications of components operating with surface waves.

What is claimed is:

1. A surface acoustic wave component comprising:
   a piezoelectric substrate;
   an electrode structure comprised of multiple layers, the electrode structure being on the piezoelectric substrate,
   a dielectric layer above the electrode structure, the dielectric layer having an acoustic impedance and completely covering both the piezoelectric substrate and the electrode structure;
   wherein the multiple layers comprise:
   a first layer system comprising at least one first layer comprised of a first material, the first material having an acoustic impedance that is less than twice the acoustic impedance of the dielectric layer; and
   a second layer system comprised of at least one second layer comprised of a second material, the second material having an acoustic impedance that exceeds twice the acoustic impedance of the dielectric layer; and wherein the second layer system has a height that is between 15% and 85% of a total height of the multiple layers.

2. The component of claim 1, wherein the second layer system has a height that is between 20% and 60% of the total height of the multiple layers.

3. The component of claim 1, wherein the second layer has a height that is between 25% and 50% of the total height of the multiple layers.

4. The component of claim 1, wherein the dielectric layer seals to a surface of the piezoelectric substrate outside of an area of the piezoelectric substrate that is occupied by the electrode structure.

5. The component of claim 1, wherein the first material comprises Al, Mg, Ti, or an aluminum alloy.

6. The component of claim 1, wherein the second material comprises Cu, Ta, Ag, Pt, Au, or a copper alloy.

7. The component of claim 1, wherein the second layer system comprises a single second layer.

8. The component of claim 7, wherein the second layer comprises a lowermost layer of the multiple layers.

9. The component of claim 7, wherein the second layer comprises an uppermost layer of the multiple layers.

10. The component of claim 1, wherein the second layer system comprises several second layers; and wherein a first layer of the first layer system is between two of the second layers.

11. The component of claim 1, wherein the first layer system comprises a single first layer.

12. The component of claim 1, wherein the first layer system comprises several first layers; and wherein a second layer of the second layer system is between two of the first layers.

13. The component of claim 1, wherein at least one of the multiple layers that faces the piezoelectric substrate comprises a bonding-agent layer.

14. The component of claim 13, wherein the bonding-agent layer comprises a Ti layer.

15. The component of claim 1, wherein a total height of the electrode structure is between 5% and 10% of a wavelength of a surface acoustic wave in the component.

16. The component of claim 1, wherein the dielectric layer comprises silicon dioxide or silicon nitride.

17. The component of claim 1, further comprising one or more additional electrode structures, each of the one or more additional electrode structures comprising multiple layers.

18. The component of claim 1, wherein the component comprises part of a high-frequency filter.

19. A surface acoustic wave component comprising:

a piezoelectric substrate;

an electrode structure comprised of multiple layers, the electrode structure being on the piezoelectric substrate, a dielectric layer that covers the electrode structure and that seals to the piezoelectric substrate, the dielectric layer having an acoustic impedance and completely covering both the piezoelectric substrate and the electrode structure;

wherein the multiple layers comprise:

a first layer system comprising at least one first layer comprised of a first material, the first material having an acoustic impedance that is less than twice the acoustic impedance of the dielectric layer; and a second layer system comprised of at least one second layer comprised of a second material, the second material having an acoustic impedance that exceeds twice the acoustic impedance of the dielectric layer.

20. The component of claim 19, wherein the first layer system comprises multiple first layers;

wherein the second layer system comprises at least one second layer among the multiple first layers; and a bonding layer adjacent to the piezoelectric substrate.

* * * * *

UNITED STATES PATENT AND TRADEMARK OFFICE
CERTIFICATE OF CORRECTION

| | | |
|---|---|---|
| PATENT NO. | : 7,589,453 B2 | Page 1 of 1 |
| APPLICATION NO. | : 11/720576 | |
| DATED | : September 15, 2009 | |
| INVENTOR(S) | : Veit Meister | |

It is certified that error appears in the above-identified patent and that said Letters Patent is hereby corrected as shown below:

Cover page, item 54 Column 1, Title:
Delete "WIDE BANDWIDTH ACOUSTIC SURFACE WAVE COMPONENT"
and Insert --SURFACE ACOUSTIC WAVE COMPONENT--

Cover page, Column 1, Inventors:
Delete "Urlike" and Insert --Ulrike--

Cover Page, Column 2, Other Publications:
Delete "Asia" and Insert --Asai--

Column 1, Line 1, Title:
Delete "WIDE BANDWIDTH ACOUSTIC SURFACE WAVE COMPONENT"
and Insert --SURFACE ACOUSTIC WAVE COMPONENT--

Signed and Sealed this

Twenty-third Day of February, 2010

David J. Kappos
*Director of the United States Patent and Trademark Office*